United States Patent [19]
Mori et al.

[11] Patent Number: 5,351,836
[45] Date of Patent: Oct. 4, 1994

[54] CONTAINER FOR PLATE-LIKE OBJECTS

[75] Inventors: Shoichi Mori, Omihachiman; Takehide Hayashi, Koganei, both of Japan

[73] Assignee: Daifuku Co., Ltd., Osaka, Japan

[21] Appl. No.: 88,853

[22] Filed: Jul. 7, 1993

[30] Foreign Application Priority Data

Jul. 8, 1992 [JP] Japan ............................ 4-047648[U]
Jan. 6, 1993 [JP] Japan ............................ 5-000061[U]
Jan. 11, 1993 [JP] Japan .................................. 5-002178

[51] Int. Cl.⁵ .............................................. A47F 7/00
[52] U.S. Cl. ..................................... 211/41; 118/500; 206/454
[58] Field of Search ................... 211/41; 206/454, 334, 206/309; 118/500

[56] References Cited

U.S. PATENT DOCUMENTS

| | | | |
|---|---|---|---|
| 4,153,164 | 5/1979 | Hofmeister et al. | 206/454 X |
| 4,471,216 | 9/1984 | Millirer | 206/454 X |
| 4,520,934 | 6/1985 | Aigo | 211/41 |
| 4,669,612 | 6/1987 | Mortensen | 206/454 |
| 5,111,936 | 5/1992 | Kos | 211/41 X |
| 5,154,301 | 10/1992 | Kos | 206/454 X |
| 5,193,682 | 3/1993 | Naito et al. | 211/41 X |
| 5,270,482 | 12/1993 | Kos | 211/41 X |

FOREIGN PATENT DOCUMENTS

| | | |
|---|---|---|
| 0100539 | 2/1984 | European Pat. Off. . |
| 3151480 | 9/1982 | Fed. Rep. of Germany . |
| 63-45830 | of 1988 | Japan . |
| 3102851 | 4/1991 | Japan . |

OTHER PUBLICATIONS

European Search Report (English language version), dated Nov. 12, 1993.
Patent Abstracts of Japan, unexamined applications, E field, vol. 12, No. 261, Jul. 22, 1988, The Patent Office, Japanese Government, p. 17, E636, No. 63–45 830 (Hitachi Tokyo).

Primary Examiner—Robert W. Gibson, Jr.
Attorney, Agent, or Firm—Webb Ziesenheim Bruening Logsdon Orkin & Hanson

[57] ABSTRACT

A plate-like object container includes a container body having an object-insertion/withdrawal opening formed in a side face thereof for allowing insertion and withdrawal of a plate-like object and a plurality of positioning recesses arranged inside the container body in a direction of the thickness of the object, with an outer periphery of each object being introduced and held in position at each recess. A hook section is provided on an upper face of the container body, the hook section including at least one pair of hook members and support members for supporting the hook members. Each hook member is formed like a plate extending in substantially parallel with an upper face of the container body, the hook members being disposed apart from each other inwardly of an outer periphery of the upper face of the container body. Each support member supports one of the hook members corresponding thereto at a position upwardly distant from the upper face of the container body in such a manner as to allow displacement of the hook members closer to each other through elasticity of the support member per se or of the container body.

20 Claims, 17 Drawing Sheets

CONTAINER FOR PLATE-LIKE OBJECTS

BACKGROUND OF THE INVENTION

1. FIELD OF THE INVENTION

The present invention relates to a container for plate-like objects and more particularly to a container including a container body having an opening formed in a side face thereof for allowing insertion and withdrawal of the objects and a plurality of positioning recesses arranged inside the container body in a direction of the thickness of the object, with an outer periphery of each object being introduced and held in position at each recess, the container further including a hook section provided on an upper face of the container body.

2. DESCRIPTION OF THE RELATED ART

FIG. 24 shows a conventional plate-like object container of the above-described type. As shown, a hook section B provided on an upper face of a container body A includes a single hook member 8 formed like a plate extending in parallel or substantially parallel with the upper face of the container body A and a support table 9 for fixedly supporting the plate-like hook member 8 at a position upwardly spaced from the upper face of the container body (see, e.g. Japanese laid-open patent gazette No. 3-102851).

Referring to a typical application of this type of plate-like object container, when an automatic machine such as an industrial robot is to grid container body A, a robot hand H of the machine will grip the body A as an engaging portion 10 formed e.g. at fingers of the robot hand H comes into engagement with the hook member 8.

However, this conventional art suffers a considerable drawback in case the operation precision of the industrial robot is not very high. In such case, the engagement between the engaging portion 10 of the robot hand H and the hook member 8 may occasionally fail. Also, if the gripping action of the robot hand H becomes excessive, the hand H may damage the hook section B, such that with the application of excessive force to the hook member 8 this hook member 8 or even the entire hook section B may be destroyed at all.

In particular, in this type of plate-like object container, in order to allow the robot hand to grasp each container even when a plurality of containers are placed closely to one another, the hook section B is usually formed small so that in plane view this section B is receded from the outer periphery of the container body A to provide peripheral space for allowing the gripping movement of the robot hand H. In such case, the above-described problem will be more likely to occur. That is, the possibility of damage is even higher in case the hook section B is formed small and fixed at an upwardly distant position from the upper face of the container body via the support table 9.

Incidentally, in order to overcome the problem of the possible damage of the hook member 8 or the entire hook section B, it is conceivable to improve the operation precision of the industrial robot or to provide the robot with a safety device to control the upper limit of the gripping force exerted by the robot hand. However, such measures will be unsatisfactory since the industrial robot thus improved or provided with the additional feature will be necessarily complicated in construction and therefore costly.

Further, such damage may occur also when the container A is displaced from its proper location. In such case, the improvement of the operational precision of the robot alone can not eliminate the possibility of damage.

Therefore, a primary object of the present invention is to provide a plate-like object container which is inexpensive and simple in construction but which can effectively solve the above-described drawback of the conventional device.

SUMMARY OF THE INVENTION

For fulfilling the above-described object, a plate-like object container, according to the present invention, comprises:

a container body having an object-insertion/withdrawal opening formed in a side face thereof for allowing insertion and withdrawal of a plate-like object and a plurality of positioning recesses arranged inside the container body in a direction of the thickness of the object, with an outer periphery of each object being introduced and held in position at each recess;

a hook section provided on an upper face of the container body, the hook section including at least one pair of hook members and support members for supporting the hook members;

wherein, each said hook member is formed like a plate extending in substantially parallel with an upper face of the container body, said hook members being disposed apart from each other inwardly of an outer periphery of the upper face of the container body; and wherein each said support member supports one of said hook members corresponding thereto at a position upwardly distant from the upper face of the container body in such a manner as to allow displacement of the hook members closer to each other through elasticity of said support member per se or of the container body.

With the above-described construction, the pair of hook members disposed part from each other are supported so that these hook members may be displayed closer to each other through the elasticity of the support members per se or that of the container body. Thus, the hook members will not be subjected excessive force even when the engaging portion of the robot hand fails to properly engage the hook members or the robot hand exerts such an excessive gripping force as to damage or destroy the hook section.

As a result, the present invention has provided a plate-like object container whose hook members or entire hook section will not be damaged or destroyed even when the container is used with an industrial robot having only relatively low operation precision.

According to one preferred embodiment of the present invention, the container body further includes, in a bottom face thereof, an engaging portion for engaging with a positioning provided at a location where the container is to be placed.

The above arrangement prevents the container body from being displaced from its proper location.

Then, with the prevention of displacement of the container body, the plate-like object container having this additional feature can more effectively prevent the failure of engagement between the engaging portion of the robot hand and the hook member and can prevent also the damage of the hook section due to the excessive amount of operation of the robot hand.

According to a further embodiment of the present invention, a stopper element for receiving an end face of the plate-like object is provided to each of those positioning recesses which are disposed adjacent the object-insertion/withdrawal opening so as to prevent the object as held within the recess from moving toward the opening, the stopper element being switchable between a stopping state and a releasing state.

With the above-described arrangement, the stopper element provided in the container body for preventing movement of the plate-like object toward the opening. Then, unlike the conventional construction (e.g. Japanese laid-open patent gazette No. 63-45830) in which the stopper element is so constructed as to constantly maintain in position the stored object by means of an urging force, the stopper element of the present invention does not contact the object as stored in the container body but comes into contact with the object only when this object starts moving toward the opening.

Further, when a significant force is applied to move the plate-like object toward the opening, as the stopper element is disposed in the vicinity of the positioning recess, it is possible to prevent curving or bending of the object between its portion supported by the recess and its further port ion contacting the stopper element.

As a result, the stopper element does not contact the plate-like object as stored in the container body and also the arrangement of the object can prevent curving or bending of the object when a significant force is applied to move this object towards the opening. That is, the plate member when stored inside the container body is free from excessive stress.

According to a still further embodiment of the present invention, the stopper element is supported by means of a plurality of struts each having one end thereof elastically supported to the stopper element and the other end thereof elastically supported to container body, with the stopper element being longitudinally movable.

With the above-described construction, one end of the stopper element is supported to be longitudinally movable by means of the struts each having one end thereof elastically supported to the stopper element and the other end thereof elastically supported to container body. Then, it becomes possible to arrange this stopper element to be switchable between stopping position and a releasing position through the longitudinal movement of the stopper element or movement of this element in the direction normal to the longitudinal direction. Moreover, this switchover operation of the stopper element between the stopping position and the releasing position can be effected without any sliding movement of this stopper element.

Thus, the invention has provided a plate-like object container which can solve the inconveniences that the durability of the container suffers through friction between the stopper element and the container body and that the dust resulting from such friction soils the stored objects or the environment.

A further advantage may be obtained by constructing the container such that the struts may return the stopper element to its stopping position by the elasticity of the portion of the strut connected to the container body or the stopper element.

With this further arrangement, as the stopper element is elastically urged to its stopping by means of the elasticity of the connecting portion, the stopper element will be switched over to the releasing position only when the element is forcibly moved in the longitudinal direction.

As the result, the plate-like object container having this additional feature achieves the further convenience that the stopper element may be automatically returned to the stopping position with release of the forcible force.

Further and other objects, features and effects of the invention will become more apparent from the following more detailed description of the embodiments of the invention with reference to the accompanying drawings.

DESCRIPTION OF THE PREFERRED EMBODIMENTS

Preferred embodiments of a plate-like object container according to the present invention will now be described in details with reference to the accompanying drawings.

Figure 1:
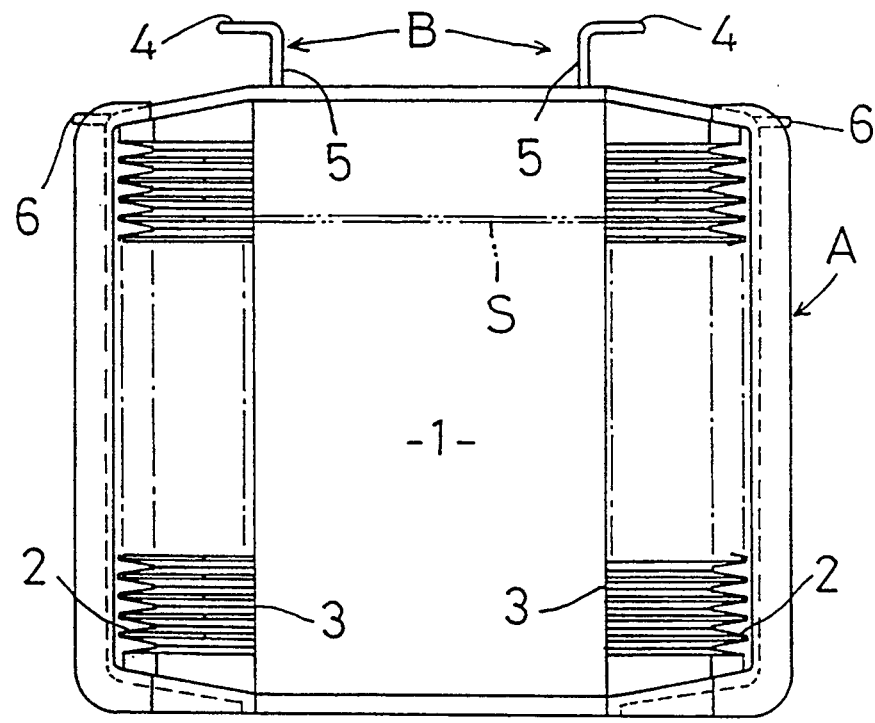
FIG. 1 is a front view showing an entire construction of a plate-like object container.

FIG. 1 shows a plate-like object container in which a plurality of plate-like objects S (e.g. wafers for producing a semiconductor electronic circuit) are stored in parallel with one another.

The plate-like object container includes., in its side face, an opening 1 for allowing insertion and withdrawal of the objects S, a container body A having a plurality of positioning recesses 2 arranged inside the container body in a direction of the thickness of the object, with an outer periphery of each object S being introduced and held in position at each recess, and the container further includes a hook section B provided on an upper face of the container body A. These members are formed integral with each other of a synthetic resin.

Figure 2:
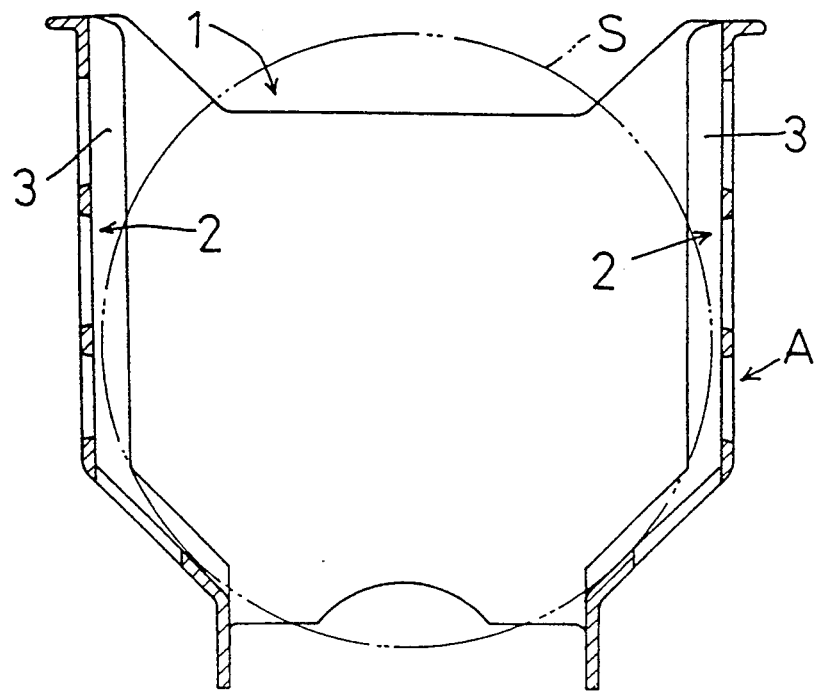
FIG. 2 is a section view showing an inside of the plate-like object container.

As shown in FIG. 2, the container body A is formed like a box having the opening 1 and on inner faces of the body there are provided a plurality of ribs 3 to form the recesses 2.

The plate-like object S is slided through the opening for insertion or withdrawal, with an outer peripheral edge of the object being engaged at the recess 2.

As shown in FIG. 1, the hook section B provided on the upper face of the container body A includes a pair of first hook members 4 formed like plates extending in parallel with the upper face and a corresponding pair of support members 5 for respectively supporting the hook members 4 at positions upwardly distant from the upper face.

The hook section B is constructed as follows. That is, when an automatic machine such as an industrial robot is to grasp the container body A, the robot hand may grasp the container as the hook members 4 are engaged with an engaging portion formed e.g. at the fingers of the robot hand. The hook members 4 are formed inwardly of the side faces of the container body A so as to allow the gripping operation by the robot hand even when a plurality of container bodies A are placed side by side and closely to one another.

Advantageously, the hook members 4 as well as the support members 5 are formed integral with the container body A of the synthetic material.

The right and left pair of first hook members 4 are supported by the support members 5 to project sideways relative to the container body A.

Figure 3:
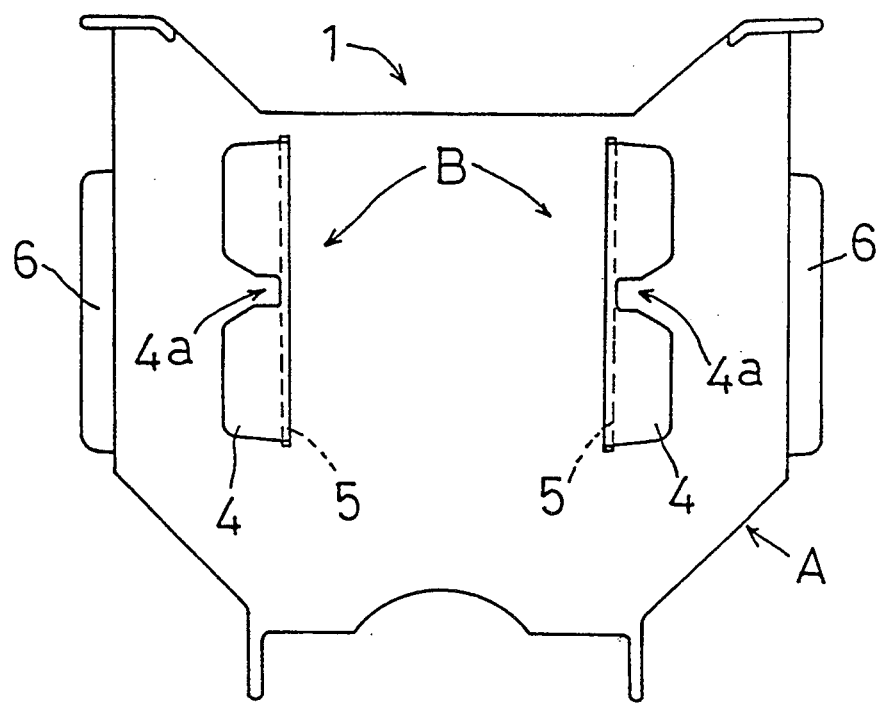
FIG. 3 is a plane view showing a holder section.

FIG. 3 is a plane view of the container body A. The first hook members 4 are tapered towards their sideways leading ends so as to facilitate the engagement with the robot hand. The projecting portion of the hook member includes, around a middle position thereof, a cutout 4a for engaging with the projecting portion of the robot hand thus holding in position the container to be grasped by the robot hand.

Incidentally, in case the engaging portion of the robot hand is formed with a tapered recess, the positioning operation can be effected by means of the tapered shape of the first hook members 4 as well.

The support members 5 are constructed in the form of plate members which extend normal to the upper face of the container body A and which connect ends of the respective first hook members 4 adjacent the center portion of the container body A with the upper face of the container body A. Advantageously, these support members 5 are formed integral with the container body A and the hook members 4.

Accordingly, when a grasping action of the robot hand applies an excessive force to the hook members 4, the support members 5 are elastically deformed or the support members 5 cause elastic bending in the upper face of the container body A. Then, as the hook members 4 are allowed to be displaced in the mutually approaching direction, damage in the hook members 4 or the entire hook section B can be effectively avoided.

As illustrated in FIG. 3, it is conceivable to provide second hook members 6 adjacent the upper side ends of the container body A.

Figure 4:
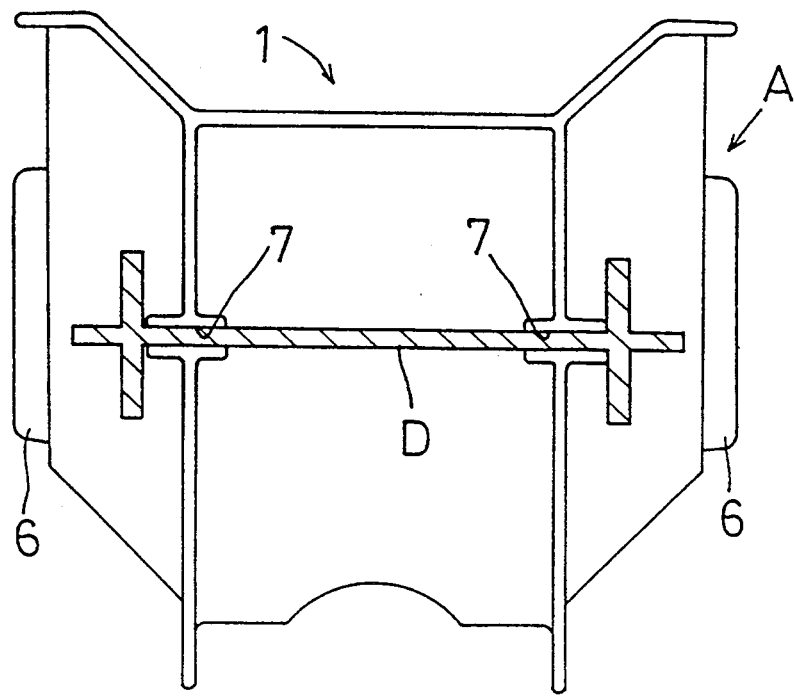
FIG. 4 is a bottom view showing an engaging groove.

As shown in FIG. 4, in a bottom face of the container body A, there are formed engaging grooves 7 acting as engaging portions for engaging with positioning portions provided at locations where the container body A is to be placed.

The engaging grooves 7 are formed as cutouts in reinforcing ribs formed on the bottom face of the container body A and the ribs extend sideways from the opposed ends of the cutouts. Each engaging groove 7 is so constructed as to come into engagement with a side of a cross-shaped projection D which is provided as the positioning portions disposed at the locations where the container is to be placed.

The hook members 4 can be formed to extend longitudinally relative to the container body A.

The specific construction of the support members 5 is not limited to the vertically extending plate member, and this member can be formed as a bar-like member or corrugated plate member which is suitable for the elastic deformation.

A further embodiment of the present invention will be described next with reference to the drawings.

Figure 5:
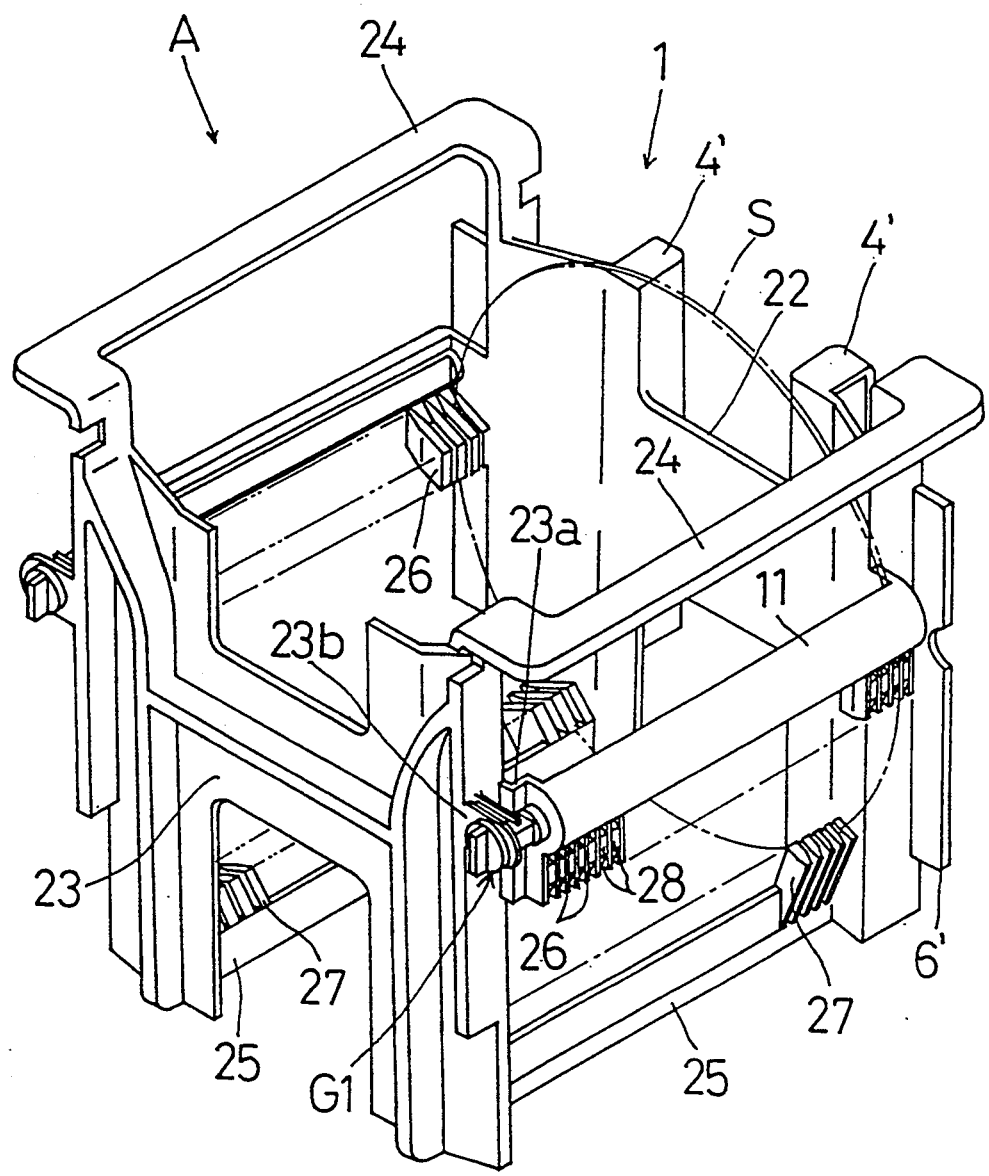
FIG. 5 is a perspective view showing an entire construction of a plate-like object container relating to a further embodiment of the present invention, the container having an opening at an upper side thereof.
Figure 6:
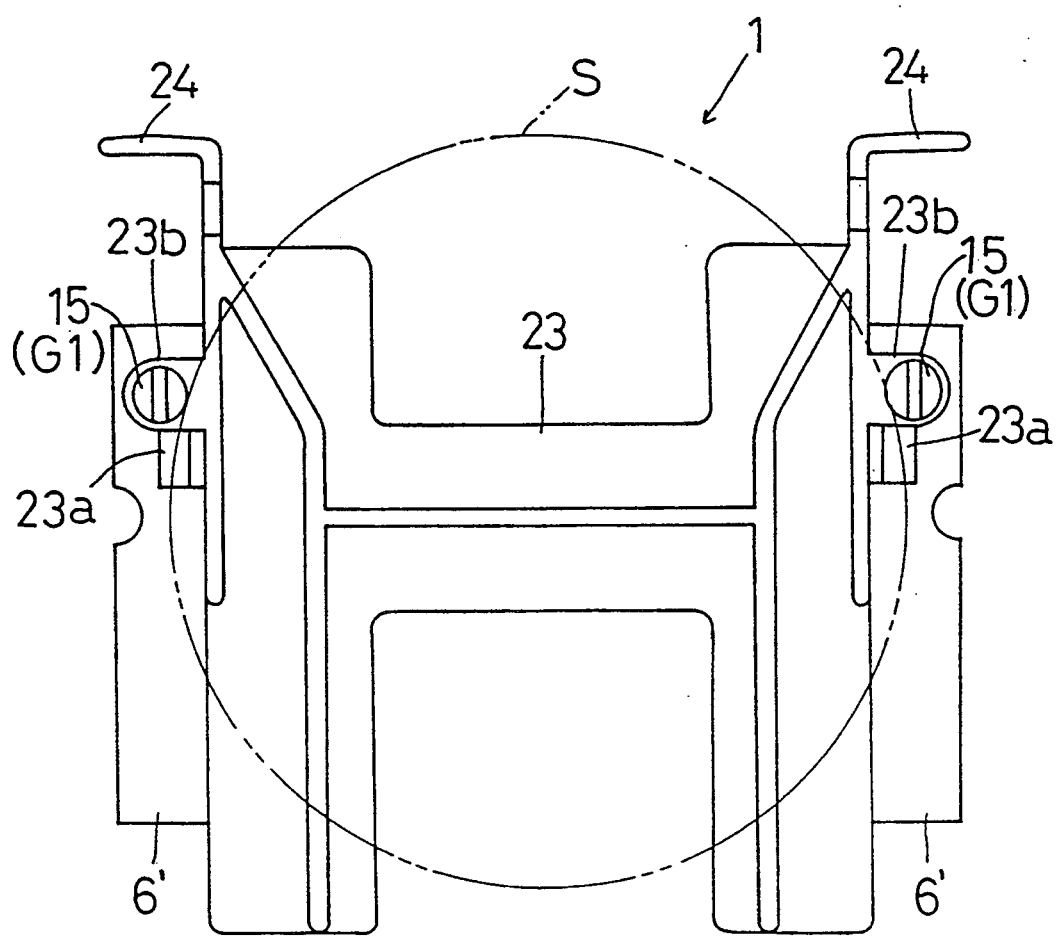
FIG. 6 is a bottom view showing a bottom plate of the plate-like object container shown in FIG. 5.
Figure 7:
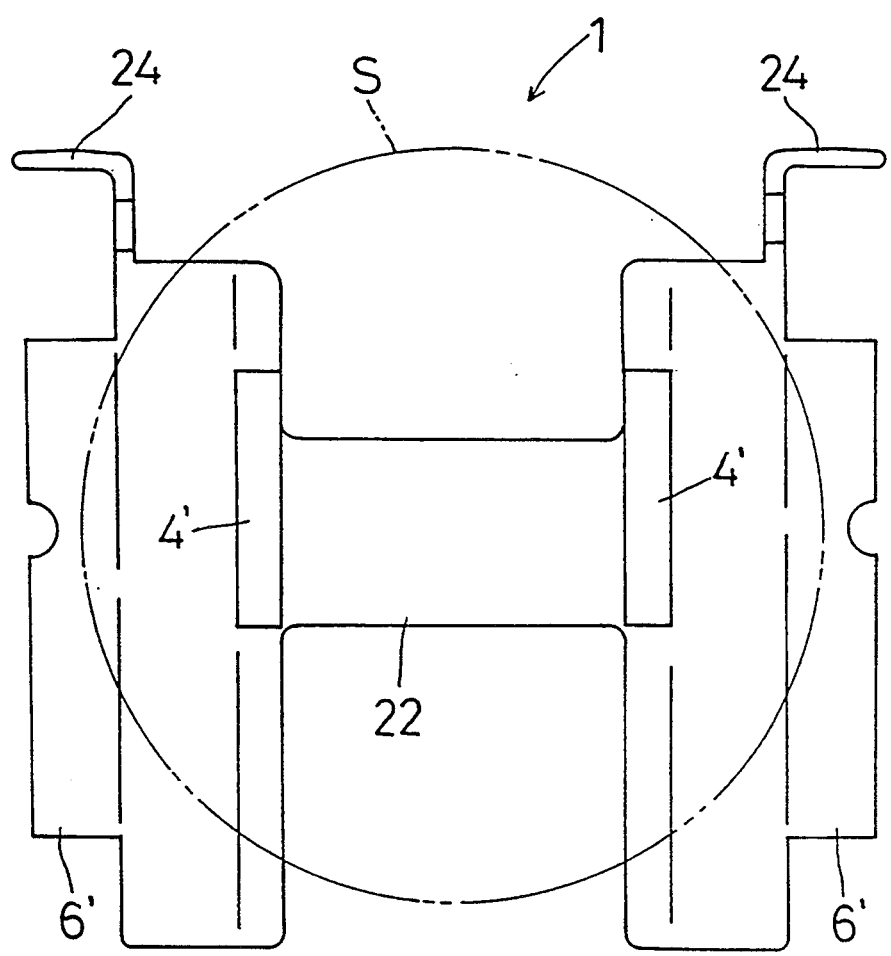
FIG. 7 is a plane view showing an upper plate of the plate-like object container shown in FIG. 5.

FIGS. 5, 6 and 7 show a plate-like object container including a container body A in which a plurality of plate-like objects S are stored in the direction of the thickness of the object, the container body having an opening 1 for insertion and withdrawal of the plate-like objects 1.

The container body A is constructed as a box-like structure including an upper plate 22 and a bottom plate 23 both of which are disposed in the thickness direction and right and left pairs of opening frame members 24 and leg frame members 25 both of which are used for connecting the upper place 22 and the bottom plate 23.

Between the upper plate 22 and the bottom plate 23, there are provided a plurality of opening-side support elements 26 and leg-side support elements 27 both acting as object support elements for respectively supporting in position a plurality of spaced outer peripheral positions of the plate-like objects S.

The opening-side support elements 26 and the opening-side support elements 27 are equidistantly arranged in the thickness direction, and an outer peripheral position of the plate-like object S is engaged into a recess formed between adjacently positioned support elements. This engagement fixedly determines the position of each object S in the thickness direction when the objects S are stored in the container.

The opening-side support elements 26 are connected to each other in the thickness direction by means of a plurality of connecting elements 28 to provide a single bar-like structure extending between the upper plate 22 and the bottom plate 23. And, opposed ends of this bar-like structure are connected respectively with an ear portion 22a of the upper plate 22 and an ear portion 23a of the bottom plate 23. A right and left pair of the bar-like structures are provided at locations corresponding approximately to the diameter of the plate-like object S as stored.

The gap between the adjacent opening-side support elements 26 formed by the connecting elements 28 is slightly wider than the thickness of the plate-like object S to allow insertion of the outer peripheral portion of this object S while preventing movement of the object S in the thickness direction.

The leg-side support elements 27 are attached to the leg frame member 25 with an inter-distance substantially equal to that formed by the opening-side support elements 26, The right and left pair of leg frame members 25 are disposed with an inter-distance therebetween slightly narrower than the diameter of the plate-like object S to receive and support lower end face portions of the plate-like object S as stored in the container.

Accordingly, as the plate-like object S is slided with its thickness direction being oriented to the upper plate 22 and the bottom plate 23, the object is inserted through the opening 1 into the container body A. With this insertion, the right and left peripheral edges of the object are engaged respectively into the recesses or gaps formed by the two opening-side support elements 26 and the two leg-side support elements 27. Consequently, the plate-like object S has its lower end face received and supported by the leg frame member 25 and fixedly held in this stored condition.

Incidentally, as shown in FIGS. 5 and 7, at the outer sides of the upper plate 22, there are provided hook members 6' to be handled by e.g. a robot hand and further hook members 4' for manual handling, so that this container body A can be manually transported.

As shown in FIGS. 5 and 6, in the container body A, at a position of the opening-side support element 26 on the side adjacent the opening 1, there is provided a stopper element G1 disposed adjacent the opening-side support element 26. This stopper element G1 is receives and stops the end face of the plate-like object S thus preventing displacement of this object S, as stored inside the container body A, toward the opening 1. This stopper element G1 is formed of a round bar opposed ends of which extend through and are supported by the ear portion 22a of the upper plate 22 and the ear portion 23a of the bottom plate 23, with the element G1 being rotatable about the axis of the bar.

Further, as shown in FIG. 5, between the ear portion 22a and the ear portion 23a, there is provided a receiver element 11 for receiving and supporting an outer peripheral face of the stopper element G1 thus preventing a middle portion of the stopper element G1 from being bent in a direction away from the plate-like object S.

Figure 8:
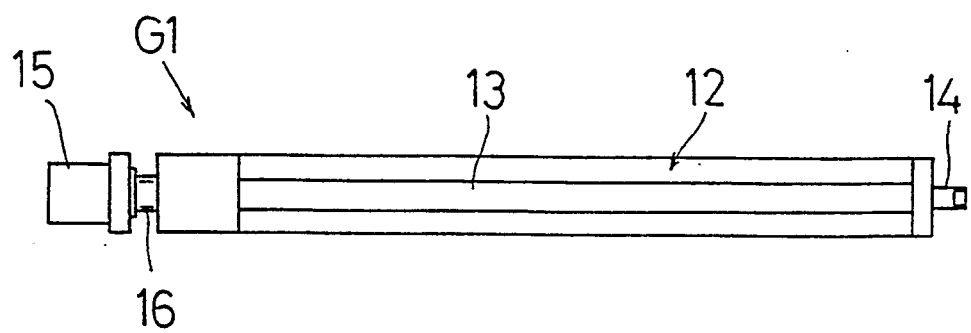
FIG. 8 is a side view showing a stopper element shown also in FIG. 5.
Figure 9:
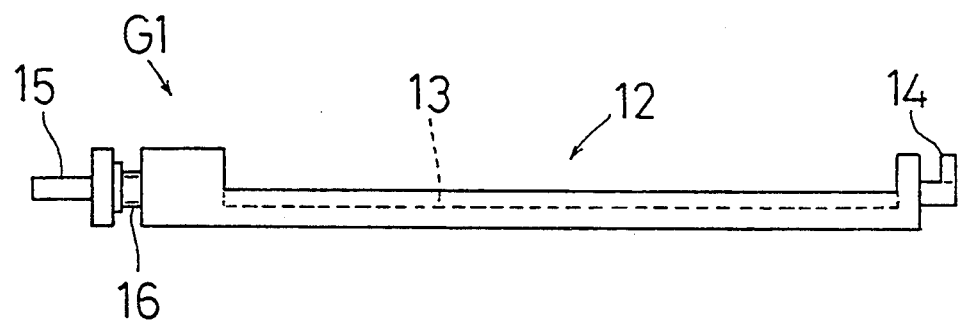
FIG. 9 is a view showing the stopper element of FIG. 8 with the element being turned by 90 degrees from its position shown in FIG. 8.

FIGS. 8 and 9 shown the details of the stopper element G1.

Figure 10:
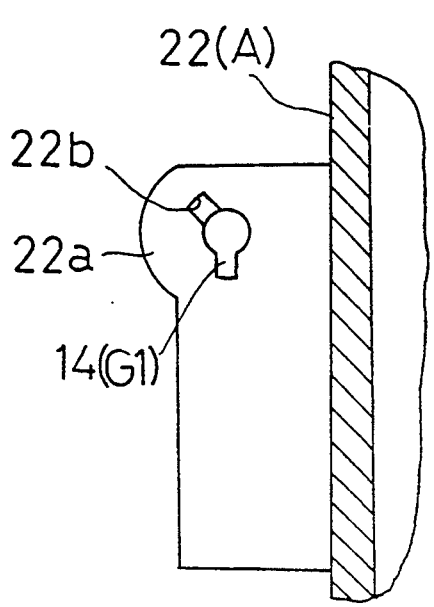
FIG. 10 is a partial section showing an ear portion of the upper plate shown in FIG. 5.

The stopper element G1 includes a cutout 12 which renders the round section of the bar structure into a semi-circular. Also, at a position of the cutout 12 adjacent the axis of the round bar, a concave portion 13 is formed for reducing the weight and the material necessary for forming the element. At one end of the stopper element G1, there is provided an anti-slip portion 14. As illustrated in FIG. 10, this anti-slip portion 14 engages with the ear portion 22a of the upper plate 22 thus preventing slippage in both pushing and pulling directions along the bar axis direction.

Incidentally, at a position of the ear portion 22a where the stopper element G1 is inserted and supported, there is provided a cutout 22b for allowing insertion of a projecting portion of the anti-slip portion 14, thus enabling assembly of the stopper element G1.

At the other end of the stopper element G1, as shown in FIGS. 8 and 9, there is provided a control portion, 15. This control portion 15 is provided in alignment with the cutting out direction of cutout so that with visual reference to the direction of the control portion 15, an operator can realize the position of the cutout 12. Beside the control portion 15 of the stopper element G1, there is formed an angular cylindrical portion 16. A chamfering direction of this angular cylindrical portion 16 is aligned with the cutting out direction of the cutout 12 and the planar direction of the control portion 15.

Figure 11:
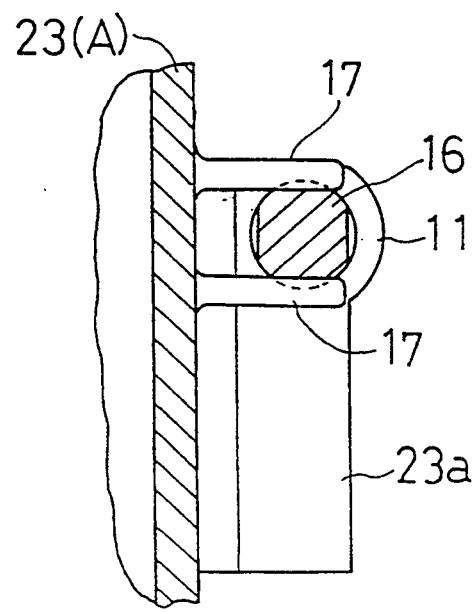
FIG. 11 is a partial section showing an ear portion of the bottom plate shown in FIG. 5.

The stopper element G1, as assembled with the container body A, its angular cylindrical portion 16 is held and engaged between a pair of elastic engaging elements 17 extending form the bottom plate 23, as illustrated in FIGS. 5 and 11.

Accordingly, the stopper element G1 becomes stable in position with each 90 degree rotation of the control portion 15.

Figure 12:
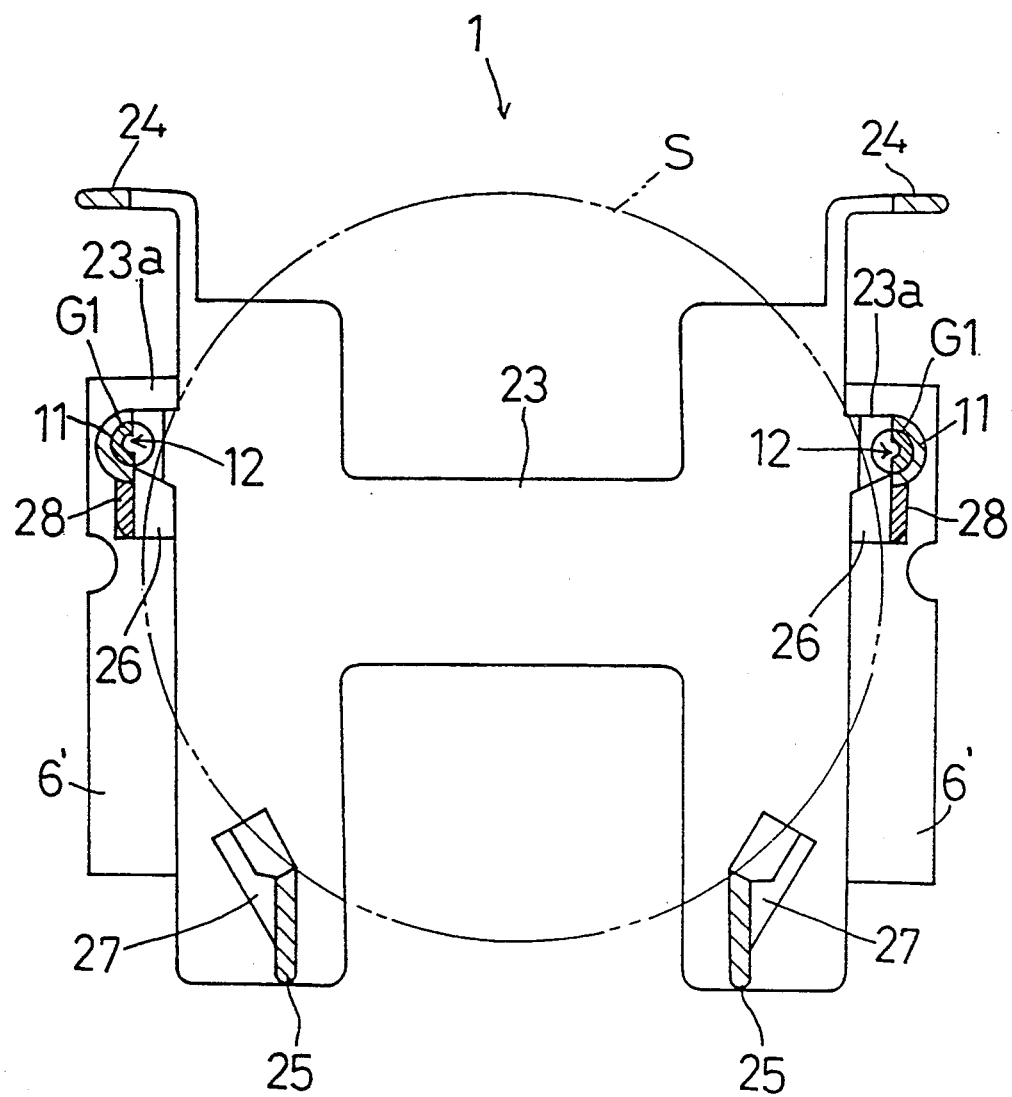
FIG. 12 is a bottom section of the container of FIG. 5 in which the stopper element is receded.

FIG. 12 is a section view of the plate-like object container under the condition corresponding to FIG. 5.

In FIG. 5, the control portion 15 of the stopper element G1 is vertically oriented. Thus, the cutout 12 of the stopper element G1 is oriented to the inner side of the container body A, as illustrated in FIG. 12. In this condition, as the stopper element G1 is receded into the receiver element 11, insertion and withdrawal of the plate-like object S is allowed. This is the releasing position of the stopper element G1.

Figure 13:
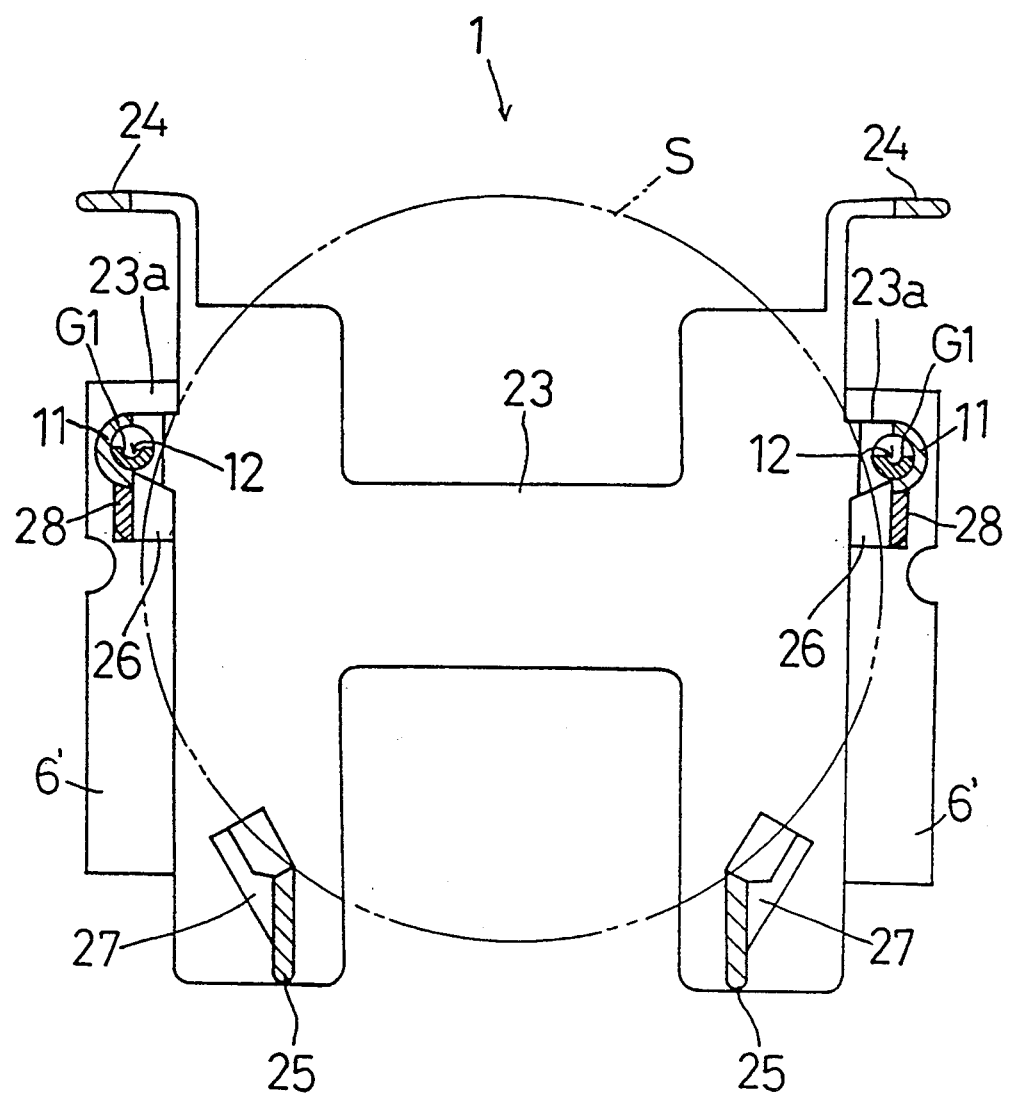
FIG. 13 is a bottom section of the container of FIG. 5 in which the stopper element is projected.

FIG. 13 is a section view illustrating a further condition where the stopper element G1 is turned 90 degrees from the position of FIG. 5. The cutout 12 of the stopper element G1 is oriented toward the opening 1 of the container body A. In this condition, a portion of the section of the stopper element G1 projects into the gap between the two opening-side support elements 26. This is the stopping position where the stopper element prevents the plate-like object S stored inside the container body A from moving towards the opening 1.

The releasing condition and the stopping condition of the stopper element G1 is selectively realized through the turning operation of the control portion 15.

In the present embodiment, the container body A, that is, the upper plate 22, bottom plate 23, opening frame member 24, leg frame member 25, ear portions 22a, 23a, 23b, opening-side support elements 26, connecting element 28, leg-side support elements 27, hook members 6', hook members 4' and the receiver element 11 are all formed of a synthetic resin. Advantageously, these elements should be formed integral with one another.

The synthetic resin can be any kind of thermoplastic resin such as polypropylene.

Advantageously, the stopper element G1 too may be integrally formed of the synthetic resin.

The support elements are not limited to the opening-side support elements 26 and the leg-side support elements 27, but may be additionally provided at a plurality of appropriate positions.

The shape of the stopper element G1 is not limited to the bar shape, but may vary depending on the convenience.

A still further embodiment of the present invention will be described next.

FIGS. 14, 15, 16, 17 and 18 show a plate-like object container for storing a plurality of plate-like objects S such as semiconductor wafers.

Figure 14:
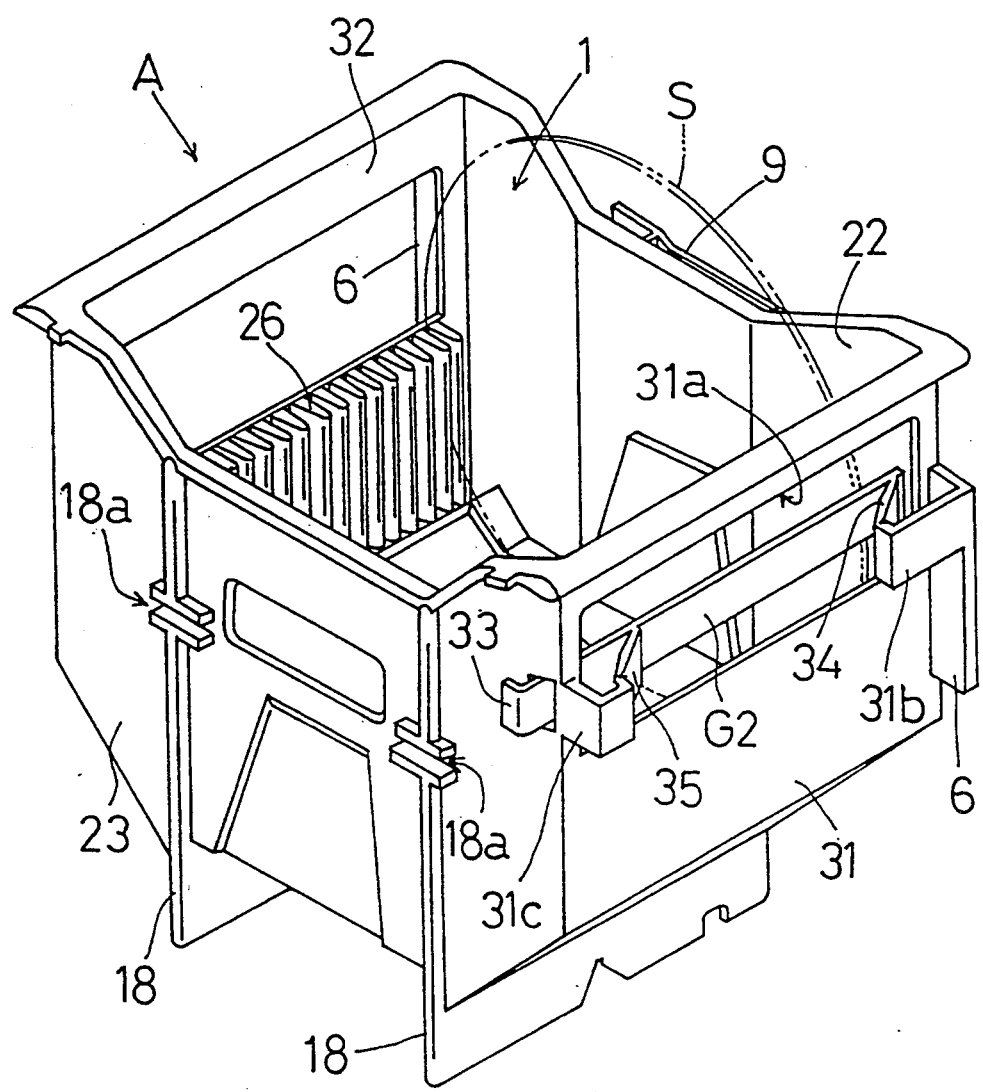
FIG. 14 is a perspective view showing an entire construction relating to a further embodiment of the present invention, the container having an opening at an upper side thereof.

As shown in FIG. 14, the container body A includes a right side wall portion 31, a left side wall portion 32, an upper plate 22 and a bottom plate 23; thus, the container body is constructed as a box-like integral structure formed of a synthetic resin.

The plate-like object S is inserted into the container body A by sliding the object through the opening 1 in parallel with the upper plate 22 and the bottom plate 23. Thus, the container body A can accommodate a plurality of the objects S as arranged side by side in the direction of the thickness of the object.

Figure 15:
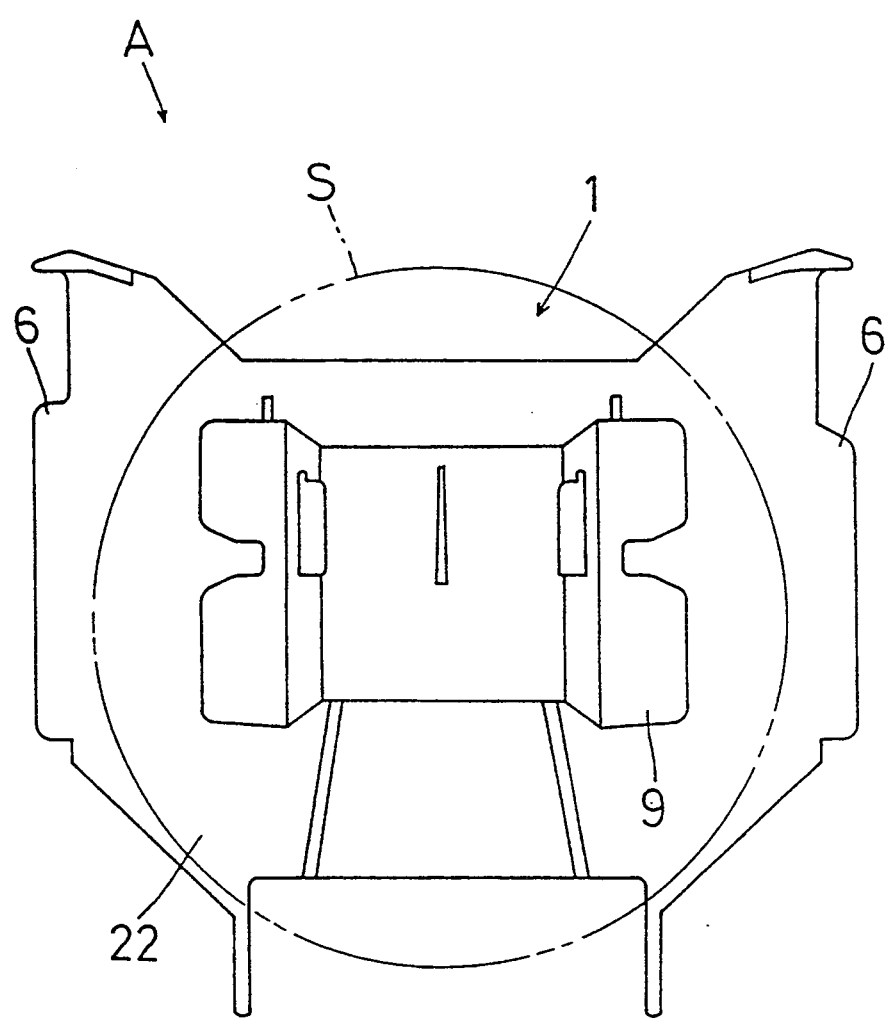
FIG. 15 is a plane view showing an upper face of the container body of FIG. 14.
Figure 17:
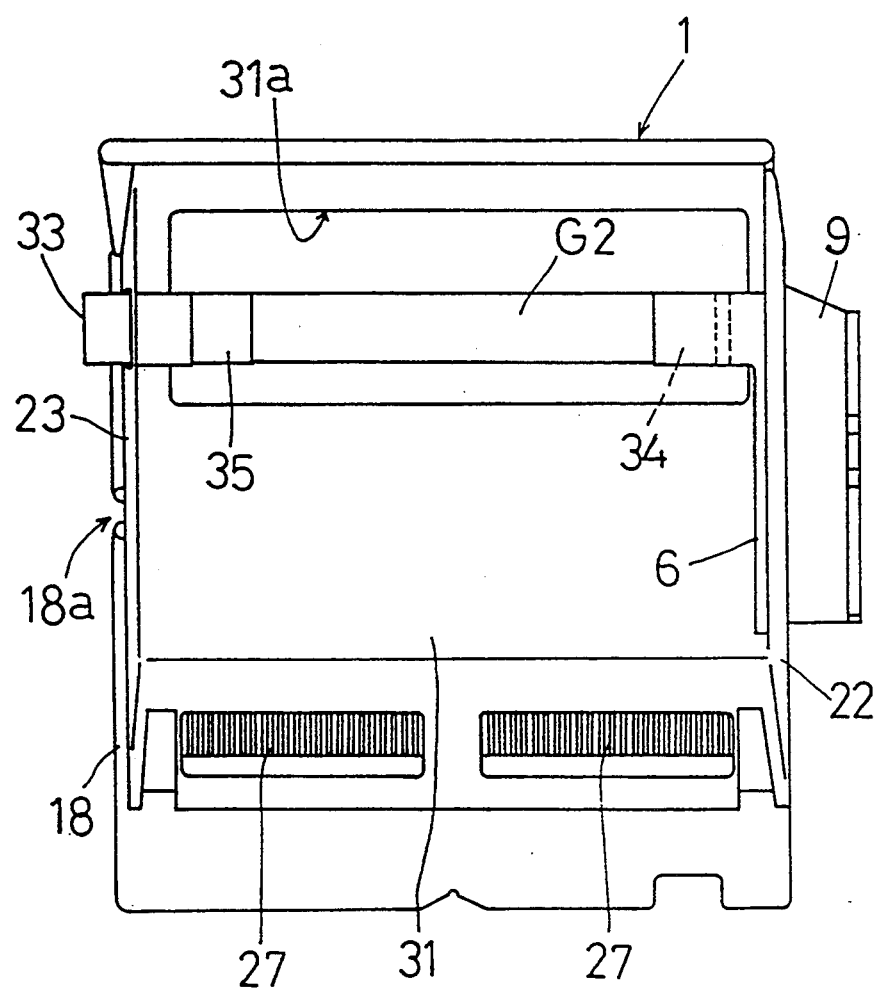
FIG. 17 is a right side view showing a right wall of the container body of FIG. 14.

On the outer face of the upper plate 22, as shown in FIGS. 15 and 17, there are provided hook members 6 for handling by e.g. a robot hand and further hook member 9 for manual handling, such that the container body A may be manually transported.

Figure 16:
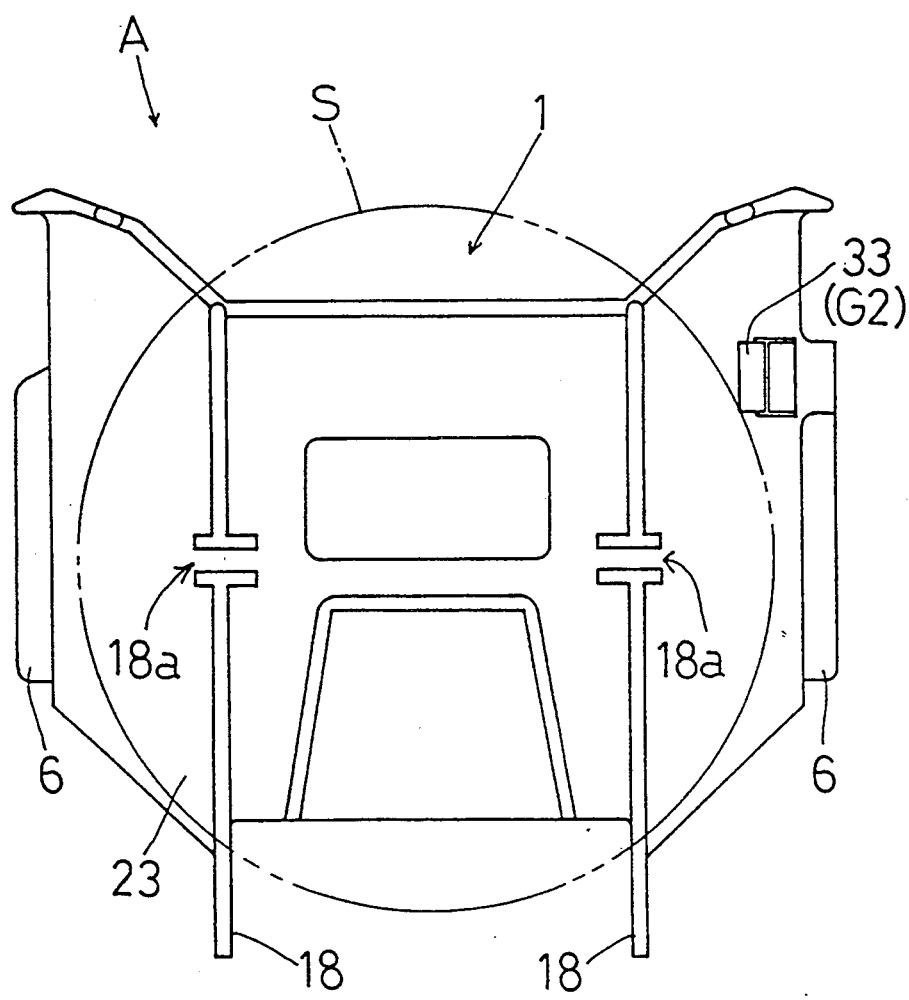
FIG. 16 is a bottom view showing a bottom face of the container body of FIG. 14.

On the outer face of the bottom plate 23, as shown in FIGS. 16 and 17, there are provided engaging portions 18a in the form of positioning cutouts of reinforcing ribs 18, so that the engaging portions engage with engaging projections provided at a location where the container is to be placed, thus fixedly positioning the container at this location.

Figure 18:
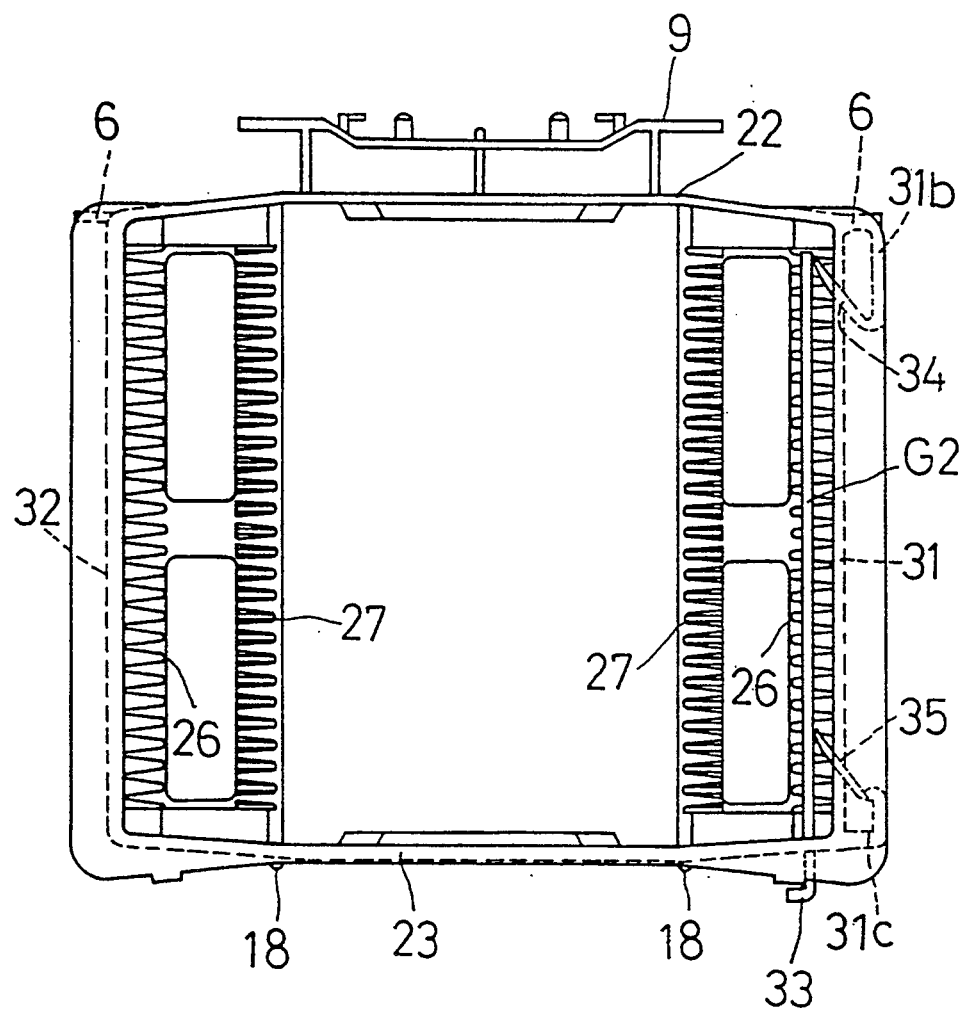
FIG. 18 is a front view of the opening of the container body of FIG. 14.

On inner sides of the right side wall portion 31 and of the left side wall portions 32, as illustrated in FIG. 18, there are provided a plurality of opening-side support elements 26 and a plurality of leg-side support elements 27. So that, between an adjacent pair of support elements, an outer peripheral of each plate-like object S is introduced and held so as to fixedly position this plate-like object S. The opening-side support elements 26 and the leg-side support elements 27 are equidistanly arranged in the direction of the thickness of the object. Then as the outer peripheral edge portions of the object S are engaged into the gaps formed between these support elements, the objects S, under the stored condition, are fixedly positioned in the thickness direction.

Therefore, the distance between the adjacent pair support elements is slightly wider than the thickness of the object to allow the insertion of the peripheral edge of the plate-like object S and the distance is of such an amount as to prevent displacement of the object S in the thickness direction.

Figure 19:
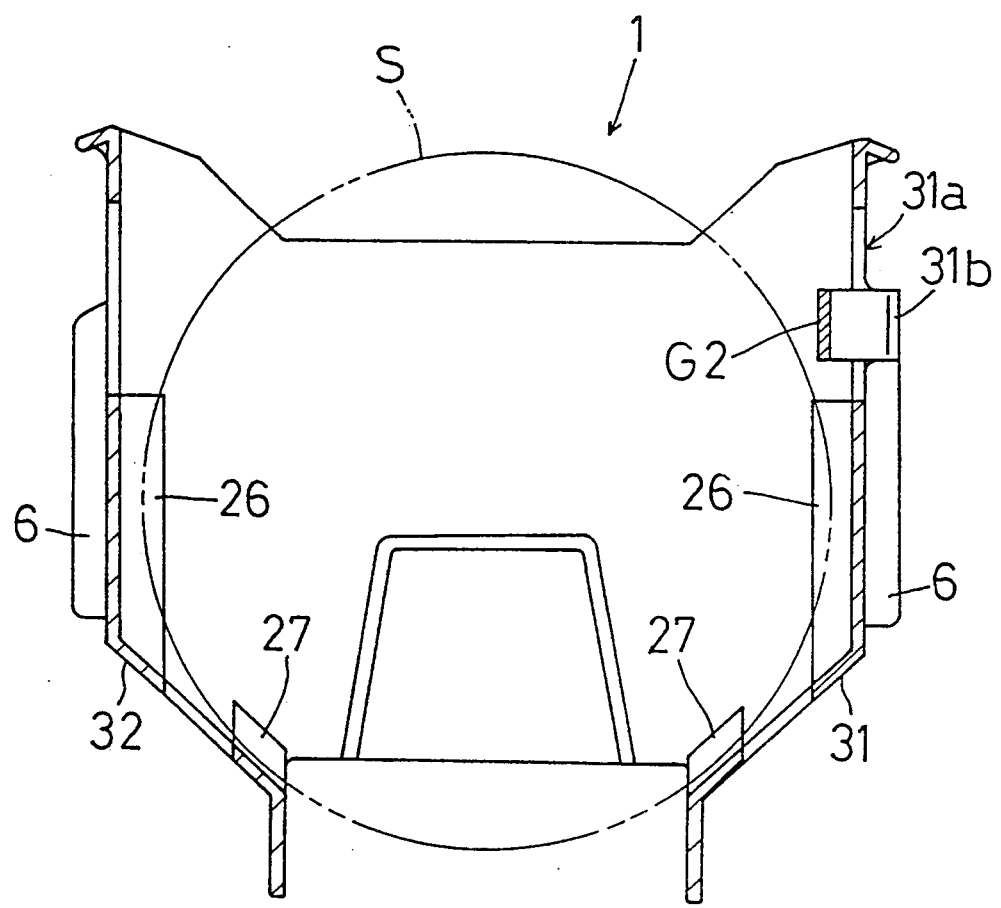
FIG. 19 is a section view of the container body of FIG. 14.

FIG. 19 is a section view of this plate-like object container.

The plate-like object S under the stored condition has its movement in the thickness direction restricted by means of the two opening-side support elements 26 and the two leg-side support elements 27. And, this storing condition is maintained as the right and left end faces of the object S and also the Further end face of the object S are received and supported by the right side wall portion 31 and the left side wall portion 32.

Figure 20:
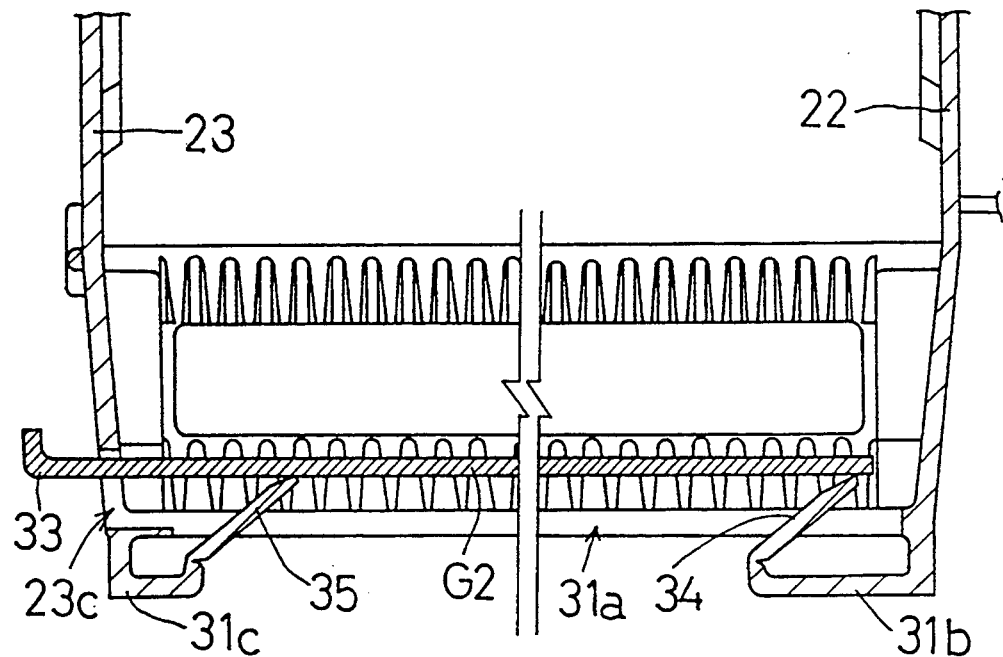
FIG. 20 is a view illustrating the stopping condition of the stopper element shown in FIG. 14.

At a position of the opening-side support element 26 provided on the right side wall portion 31 and adjacent the opening 1, there is provided a stopper element 62. This stopper element G2 functions to receive and stop movement of all the stored plate-like objects S toward the opening 1. More particularly, as shown in FIG. 18, the stopper element G2 is formed as an elongate element extending substantially from the upper plate 22 to the bottom plate 23 so as to be able to receive and stop the movement of all the stored objects S toward the opening 1. On the side of the bottom plate 23, the plate-like object S extends through the bottom plate 23 to the outside of the container body A to form a projection 33. Further, the stopper element G2, as illustrated in FIG. 20, is supported to the container body A by means of a pair of struts 34, 35 of a same length.

The strut 34 or 35 has its one end elastically connected to the stopper element G2, an intermediate portion extending through an opening 31a defined in the right side wall portion 31 and has its other end elastically connected to a connector arm 31b or 31c both of which are formed on the outer side of the container body A. As a result, the stopper element G2 is rendered longitudinally movable and the element G2 is vertically moved also with this longitudinal movement.

Incidentally, a through hole 23c formed in the bottom plate 23 though which the stopper element G2 extends is formed sufficiently larger than the stopper element G2, so as to avoid contact between the stopper element G2 and the container body A when the stopper element G2 is moved.

The stopper element G2 can be switched over between a stopping position and a releasing position by projecting or receding the projection 33 relative to the container body A.

FIG. 20 illustrates the stopper element G2 at its stopping position. In this condition, the stopper element G2 is located away from the right side wall portion 31 and projects inside the container body A. As a result, as illustrated in FIG. 19, movement of the plate-like object S toward the opening 1 is prevented.

Incidentally, in this condition, the projection 33 of the stopper element G2 is located at its projecting position and also no forcible force is applied to the stopper element G2.

Figure 21:
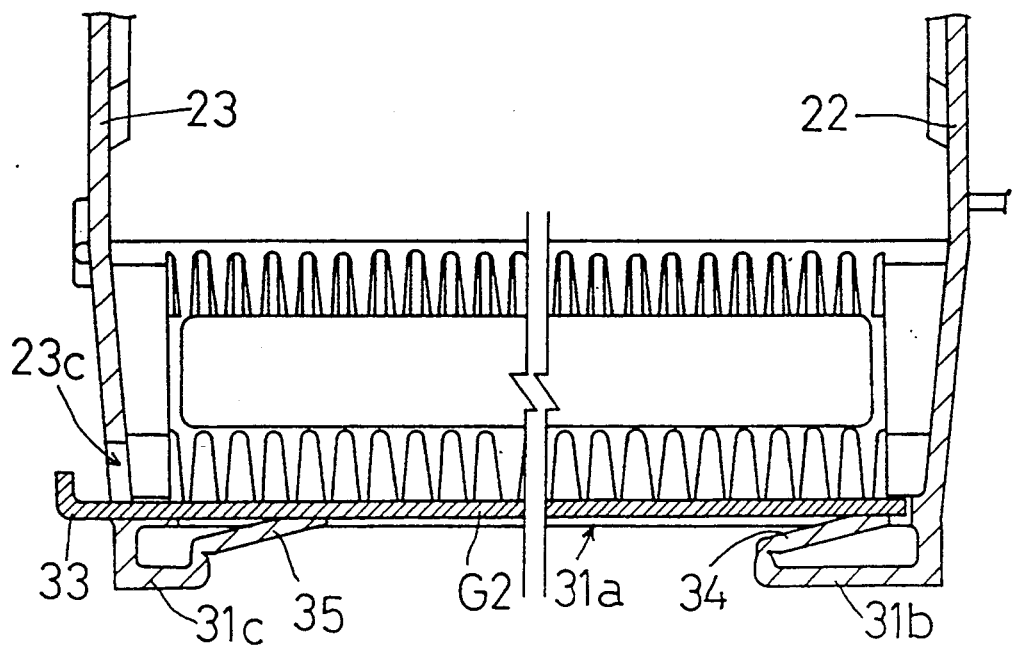
FIG. 21 is a view illustrating the releasing condition of the stopper element shown in FIG. 14.

FIG. 21 illustrates the stopper element 22 at its releasing position. The projection 33 of the stopper element G2 is subjected to some amount of forcible force in the direction where this projection 33 recedes relative to the container body A. Further, the connecting portions located at the opposed ends of the struts 34, 35, through the elasticity, allow longitudinal movement of the stopper element G2. In this condition, the stopper element G2 is moved in parallel to the upper plate 22 and also is receded toward the right side wall portion 31. As a result, the movement of the plate-like object S toward the opening 1 is allowed.

The forcible force for causing the projection 33 to recede is obtained from the weight of the container per se.

More particularly, as the container body A is placed at its proper location with the upper plate 22 and the lower plate 23 being oriented upwards and onwards respectively, the projection 33 comes into contact with the placing position and also the container body A, by its own weight, moves down to the location against the elasticity of the struts 34, 35. With this, the projection 33 recedes relative to this container body A.

The struts 34, 35 are constructed so that the stopper element G2 may be urgedly returned to its stopping position by the elasticity of the portions of these struts connected with the container body A or the stopper element G2. Thus, as the container body A is again lifted up from the location, the stopper element G2 is automatically switched over from the releasing position to the stopping position.

Incidentally, in this embodiment, the stopper element G2 and the struts 34, 35 ape formed integral to each other of a synthetic resin, and this integral unit is fused to attaching arms 31b, 31c of the container body A.

The number of the struts are not limited to the two struts 34, 35, but may vary depending on the convenience.

In the above-described embodiment, the forcible force used for recession of the projection 33 is exerted when the container body A is placed down onto the placement location with the upper plate 22 and the bottom plate 23 being oriented upwards and downwards respectively. Instead, as the container body A may be placed with any orientation, it is conceivable for the projection 33 to be receded by a force of an appropriate pressing means.

As to the stopping and releasing positions of the stopper element. G2, it is conceivable to arrange so that the stopping position is realized in association with the receding movement of the projection 33 while the releasing position is realized in association with the projecting movement of the projection 33.

A further embodiment of the stopper element will be described next.

Figure 22:
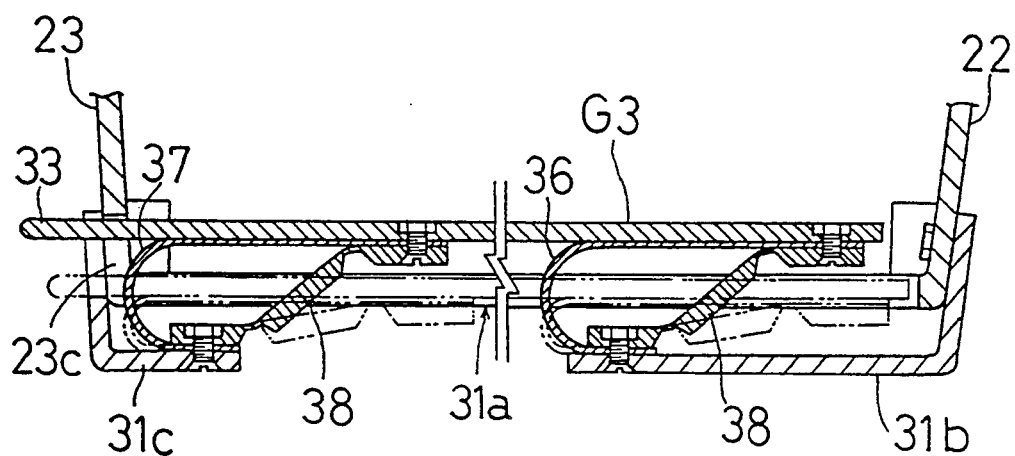
FIG. 22 is a view illustrating the stopping condition of a stopper element relating to a still further embodiment.

FIG. 22 shows a stopper element G3 supported by struts 36, 37 constructed as elastic semi-circular elements. Each of the struts 36 and 37 has its one end elastically connected to the stopper element G3, its intermediate portion extending through an opening 31a defined in the right side wall portion 31 and has its other end elastically connected to connecting arms 31b, 31c attached to the outside of the container body A. Further, hinge members 38 are connected to the inner ends of the struts 36, 37 so as to appropriately adjust the movements of these struts 36, 37. More particularly, with these hinge members 38, the stopper element G3 is rendered longitudinally movable and also the element is moved also in the vertical direction with the longitudinal movement. The releasing condition of the stopper element G3 is realized through a receding movement of the projection 33, as indicated by a two-dot chain line.

The stopper element G3 can be switched over between the stopping position and the releasing position by projecting or receding the projection 33 relative to the container body A.

Figure 23:
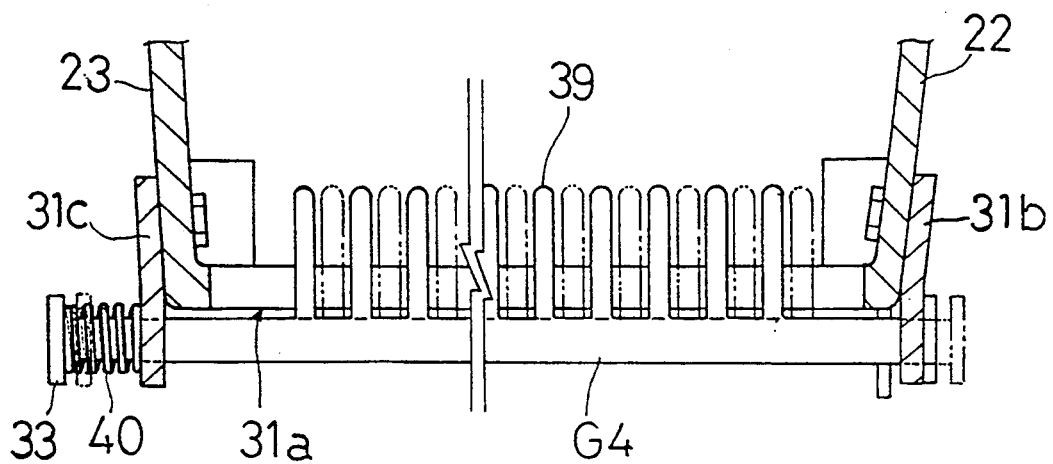
FIG. 23 is a view illustrating the releasing condition of a stopper element relating to a still further embodiment.
Figure 24:
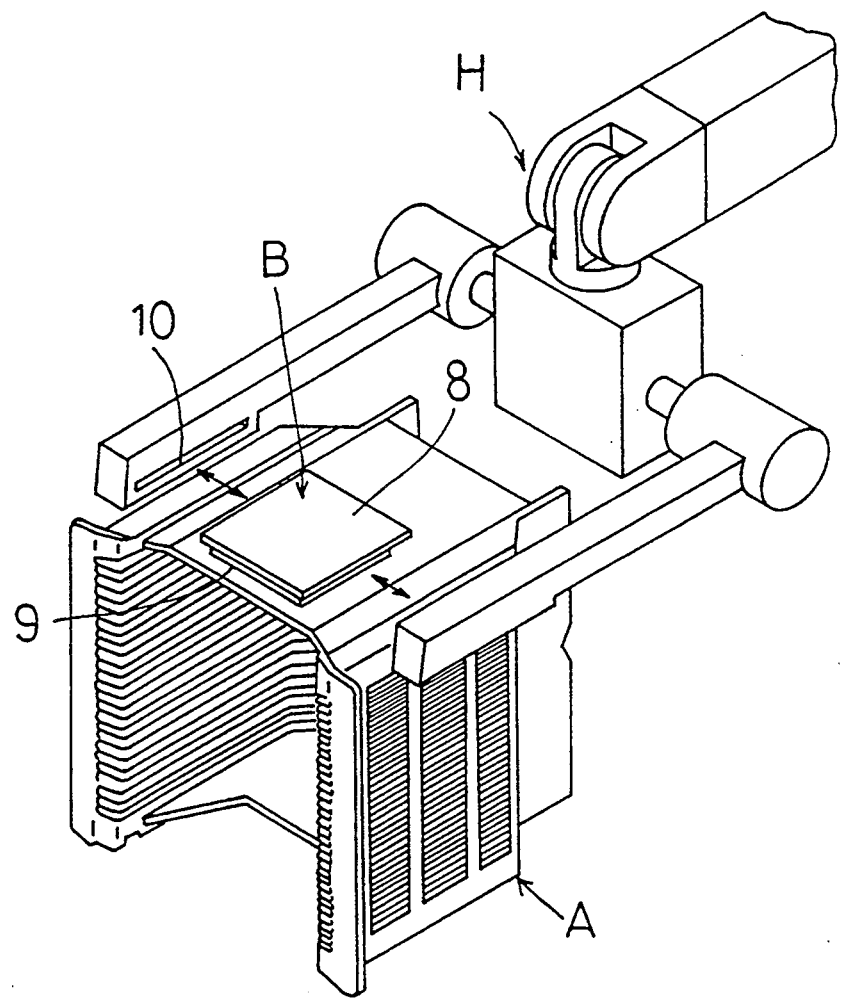
FIG. 24 is a perspective view showing a holder section of a typical conventional plate-like object container.

FIG. 23 shows a stopper element G4 according to a still further embodiment. This stopper element G4 includes a plurality of projections 39 arranged in the form of a comb, the projections 39 coming into contact with positions of the end faces of a plurality of plate-like objects S as stored inside the container body A. And, a gap between the adjacent projections 39 corresponds to the width between the adjacently stored plate-like objects S. The projections 39 extend through openings 31a defined in the right side wall portion 31. Further, this stopper element G4 has an angular cross section and extends through substantially triangular openings defined in the connecting arms 31b and 31c attached to the outer side of the container body A, so that the element G4 is restricted against rotation. Also, a projection 33 is formed at one end of the stopper element G4, and a coil spring 40 as an urging means is interposed between the leading end of this projection 33 and the connecting arm 31c so as to normally urge the projection 33 toward the outside to the position for preventing movement of the plurality of plate-like objects S stored inside the container body A. On the other hand, the releasing condition of the stopper element G4 is realized when the receding movement of the projection 33 increases the inter-distance between the projections 39 in the longitudinal direction by an amount corresponding to the width between the adjacently stored plate-like objects S. Incidentally, the urging means is not limited to the coil spring described above, but may be any type of spring.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which become within the meaning and range of equivalency of the claims are therefore intended to be embraced therein.

What is claimed is:

1. A plate-like object container comprising:
   a container body having an object insertion/withdrawal opening formed in a side face thereof for allowing insertion and withdrawal of a plate-like object and a plurality of positioning recesses arranged inside the container body in a direction of the thickness of the object, with, an after periphery of each object being introduced and held in position at each recess;
   a hook section provided on an upper face of the container body, the hook section including at least one pair of hook members and support members for supporting the hook members;
   wherein, each said hook member is formed like a plate extending in substantially parallel with upper face of the container body, said hook members being disposed apart from each other inwardly of an outer periphery of the upper face of the container body; and
   wherein each said support member supports one of said hook members corresponding thereto at a position upwardly distant from the upper face of the container body in such a manner as to allow displacement of the hook members closer to each other through elasticity of said support member per se or of the container body.

2. A plate-like object container as defined in claim 1, wherein said hook section and said container body are formed of a synthetic resin and integrally each other.

3. A plate-like object container as defined in claim 2, wherein said plate-like object comprises a wafer for manufacturing a semiconductor circuitry.

4. A plate-like object container as defined in claim 1, wherein in a plane view each said hook member is tapered towards a lateral side of said container body and defines a cutout at a central position thereof.

5. A plate-like object container as defined in claim 1, wherein said container body includes, in a bottom face thereof, an engaging portion for engaging with a positioning portion provided at a location where said container body is to be placed.

6. A plate-like container as defined in claim 4, wherein said hook section and said container body are formed of a synthetic resin and integrally of each other.

7. A plate-like object container as defined in claim 5, wherein said plate-like object comprises a wafer for manufacturing a semiconductor circuitry.

8. A plate-like object container as defined in claim 6, wherein said engaging portion is formed as a cutout in a reinforcing rib formed on the bottom face of said container body and said rib extends sideways from opposed ends of said cutout, said engaging portion being so constructed as to come into engagement with a side of a cross-shaped projection a plurality of which are provided as the positioning portions disposed at the locations where said container body is to be placed.

9. A plate-like object container as defined in claim 1, wherein each said recess is formed between an adjacent pair of support elements.

10. A plate-like object container as defined in claim 9, wherein said container body includes a stopper element for receiving an end face of said plate-like object so as to prevent said object as stored in said container body from moving toward said opening, said stopper being provided to each of said support elements which are disposed on the side of said opening and said stopper being positioned closer to said opening relative to said support element, said stopper element being switchable between a stopping position and releasing position.

11. A plate-like object container as defined in claim 10, wherein said stopper element is formed of a round bar opposed ends of which extend through and are supported by respective ear portions of upper and bottom plates of said container body, with said bar element being rotatable about the axis of the bar.

12. A plate-like object container as defined in claim 11, wherein a receiver element is provided for receiving and supporting an outer peripheral face of said stopper element thus preventing a middle portion of the stopper element from being bent in a direction away from said plate-like object.

13. A plate-like object container as defined in claim 12, wherein said stopper element includes a cutout which renders the round section of the bar structure into a semi-circular and wherein at a position of said cutout adjacent the axis of the round bar, a concave portion is formed, an anti-slip portion being provided at one end of said stopper element, said anti-slip portion engaging with said ear portion of said upper plate thus preventing slippage in both pushing and pulling directions alone the bar axis direction.

14. A plate-like object container comprising:
a container body having an object-insertion/withdrawal opening formed in a side face thereof for allowing insertion and withdrawal of a plate-like object and a plurality of positioning recesses arranged inside the container body in a direction of the thickness of the object, with an outer periphery of each object being introduced end held in position at each recess;
a hook section provided on an upper face of the container body, the hook sect ion including at least one pair of hook members and support members for supporting the hook members;
a stopper element for receiving an end face of said plate-like object so as to prevent said object as stored in said container body from moving toward said openings;
wherein, each said hook member is formed like a plate extending in substantially parallel with an upper face of the container body, said hook members being disposed apart from each other inwardly of an outer periphery of the upper face of the container body; and
wherein each said support member supports one of said hook members corresponding thereto at a position upwardly distant from the upper face of the container body in such a manner as to allow displacement of the hook members closer to each other through elasticity of said support member per se or of the container body.

15. A plate-like object container as defined in claim 14, wherein said stopper element includes an elongated axis and is movable in the longitudinal direction and a direction normal thereto in order to be switched over between a stopping position and a releasing position.

16. A plate-like object container as defined in claim 15, wherein said stopper element is supported by a plurality of struts each having one end thereof elastically connected to said stopper element and the other end thereof elastically connected to said container body.

17. A plate-like object container as defined in claim 16, wherein said stopper element is urged to said stopping position by means of the elasticity of said ends of the support element elastically connected to said container body and said stopper element respectively.

18. A plate-like object container as defined in claim 15, wherein each said strut is constructed as an elastic element having a semi-circular section and inner ends of said struts are connected to each other via a hinge so as to allow said movements of the stopper element in the longitudinal direction and the direction normal thereto.

19. A plate-like object container as defined in claim 15, wherein said stopper element includes a plurality of projections arranged in the form of a comb, said projections coming into contact with positions of the end faces of said plate-like objects as stored inside the container body, a gap between the adjacent projections corresponding to a width between the adjacently stored plate-like objects, said stopper element being normally urged by an urging means to the position for preventing the movement of said plate-like object.

20. A plate-like object container as defined in claim 10, wherein said stopper element has a substantially angular cross section.

* * * * *

UNITED STATES PATENT AND TRADEMARK OFFICE
CERTIFICATE OF CORRECTION

PATENT NO. : 5,351,836
DATED : October 4, 1994
INVENTOR(S) : Shoichi Mori and Takehide Hayashi It is certified that error appears in the above-indentified patent and that said Letters Patent is hereby corrected as shown below:

Column 1 Line 29 "grid" should read --grip--.

Column 1 Line 31 "at" should read --as--.

Column 2 Line 38 "part" should read --apart--.

Column 2 Line 39 "displayed" should read --displaced--.

Column 2 Line 55 after "positioning" insert --portion--.

Column 3 Line 22 "port ion" should read --portion--.

Column 3 Line 64 after "stopping" insert --position--.

Column 6 Line 48 "place 22" should read --plate 22--.

Column 7 Line 41 "receives" should read --received--.

Column 7 Line 56 "shown" should read --show--.

Column 8 Line 9 after "cutout" insert --12,--.

Column 8 Line 21 "form" should read --from--.

Column 9 Line 34 after "peripheral" insert --portion--.

Column 9 Line 56 "Further" should read --further--.

UNITED STATES PATENT AND TRADEMARK OFFICE
CERTIFICATE OF CORRECTION

PATENT NO. : 5,351,836

DATED : October 4, 1994

INVENTOR(S) : Shoichi Mori and Takehide Hayashi

It is certified that error appears in the above-indentified patent and that said Letters Patent is hereby corrected as shown below:

Column 9 Line 61 "62." should read --G2.--.

Column 10 Line 17 "though" should read --through--.

Column 10 Line 68 "ape" should read --are--.

Claim 1 Line 22 Column 12 "with, an after" should read --with an outer--.

Claim 1 Line 30 Column 12 after "with" insert --an--.

Claim 2 Line 44 Column 12 after "integrally" insert --of--.

Claim 13 Line 39 Column 13 "alone" should read --along--.

Claim 14 Line 50 Column 13 "sect ion" should read --section--.

Signed and Sealed this

Thirteenth Day of December, 1994

Attest:

BRUCE LEHMAN

*Attesting Officer*     *Commissioner of Patents and Trademarks*